(12) United States Patent
Lo et al.

(10) Patent No.: US 11,728,308 B2
(45) Date of Patent: Aug. 15, 2023

(54) SEMICONDUCTOR DEVICE UNDER BUMP STRUCTURE AND METHOD THEREFOR

(71) Applicant: NXP B.V., Eindhoven (NL)

(72) Inventors: Tsung Nan Lo, Taoyuan (TW); Sharon Huey Lin Tay, Shah Alam (MY); Antonio Aguinaldo Marquez Macatangay, Sta. Rosa (PH)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/239,888

(22) Filed: Apr. 26, 2021

(65) Prior Publication Data

US 2022/0344296 A1 Oct. 27, 2022

(51) Int. Cl.
*H01L 23/00* (2006.01)
*H01L 23/498* (2006.01)
*H01L 23/532* (2006.01)

(52) U.S. Cl.
CPC ........ *H01L 24/16* (2013.01); *H01L 23/49811* (2013.01); *H01L 23/53228* (2013.01); *H01L 24/11* (2013.01); *H01L 2224/0401* (2013.01); *H01L 2224/081* (2013.01); *H01L 2924/01029* (2013.01)

(58) Field of Classification Search
CPC .............. H01L 24/16; H01L 23/49811; H01L 23/53228; H01L 24/11; H01L 2224/0401; H01L 2224/081; H01L 2924/01029
See application file for complete search history.

(56) References Cited

U.S. PATENT DOCUMENTS

| | | |
|---|---|---|
| 6,790,759 B1 | 9/2004 | Wang et al. |
| 6,930,032 B2 | 8/2005 | Sarihan et al. |
| 9,059,158 B2 | 6/2015 | Tsai et al. |
| 2003/0032276 A1 | 2/2003 | Kim |
| 2011/0101521 A1 | 5/2011 | Hwang et al. |
| 2014/0374899 A1 | 12/2014 | Yang et al. |
| 2015/0048517 A1* | 2/2015 | Keser ............... H01L 24/27 257/774 |
| 2016/0056226 A1* | 2/2016 | Song ............... H01L 23/3114 257/528 |
| 2018/0040575 A1* | 2/2018 | Lin ............... H01L 24/13 |
| 2018/0331061 A1* | 11/2018 | He ............... H01L 24/03 |

(Continued)

OTHER PUBLICATIONS

Chang, S., "Shape-controlled, high fill-factor microlens arrays fabricated by a 3D diffuser lithography and plastic replication method", Optic Express, vol. 12, Issue 25, pp. 6366-6371, 2004.

(Continued)

*Primary Examiner* — Douglas W Owens

(57) ABSTRACT

A method of manufacturing a semiconductor device is provided. The method includes depositing a non-conductive layer over a semiconductor die. An opening is formed in the non-conductive layer exposing a portion of a bond pad of the semiconductor die. A cavity is in the non-conductive layer with a portion of the non-conductive layer remaining between a bottom surface of the cavity and a bottom surface of the non-conductive layer. A conductive layer is formed over the non-conductive layer and the portion of the bond pad. The conductive layer is configured to interconnect the bond pad with a conductive layer portion over the cavity.

13 Claims, 8 Drawing Sheets

(56) References Cited

U.S. PATENT DOCUMENTS

2020/0152858 A1* 5/2020 Moe ..................... H01L 41/273

OTHER PUBLICATIONS

Galeano, J., "Microfabrication of position reference patterns onto glass microscope slides for high-accurate analysis of dynamic cellular events", Technologicas, vol. 20, No. 39, Aug. 2017.
Hsieh, M., "Solder Joint Fatigue Life Prediction in Large Size and Low Cost Wafer-Level Chip Scale Packages", Conference on Electronic Packaging Technology Proceedings, ICEPT 2014.
Wu, M., "Ufi (UBM-Free Integration) Fan-In WLCSP Technology Enables Large Die Fine Pitch Packages", 2016 IEEE 66th Electronic Components and Technology Conference, May 2016.

* cited by examiner

US 11,728,308 B2

SEMICONDUCTOR DEVICE UNDER BUMP STRUCTURE AND METHOD THEREFOR

BACKGROUND

Field

This disclosure relates generally to semiconductor device packaging, and more specifically, to a semiconductor device under bump structure and method of forming the same.

Related Art

Today, the electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

The packaging of an IC device is increasingly playing a role in its ultimate performance. For example, WLCSP components are used in the assembly of mobile devices (e.g., mobile phones, tablet computers, laptop computers, remote controls, etc.), WLCSP components save valuable space in mobile applications.

During manufacturing, WLCSP devices may be subjected to a number of processes which may affect manufacturing cost, product yield and product reliability. The yield has a direct bearing on the cost of the finished mobile product. The reliability affects the longevity of the finished mobile product.

There is a need for a WLCSP assembly process which can address the challenges raised by the needs of mobile applications, for example.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a low cost semiconductor device packaging with under bump structure. The under bump structure is formed utilizing the redistribution layer of a wafer level chip scale packaging (WLCSP), for example. A cavity formed in a non-conductive layer formed over the semiconductor device serves as a basis for the under bump structure. The redistribution layer is formed over the non-conductive layer, including the cavity, and provides interconnect traces from a bond pad of the semiconductor device to the under bump structure. The redistribution layer portion over the cavity serves as a "socket" of the under bump structure configured for placement and attachment of a solder ball, for example. By utilizing the redistribution layer to form the under bump structure, a simplified WLCSP structure is formed, and manufacturing costs may be significantly reduced.

Figure 1:
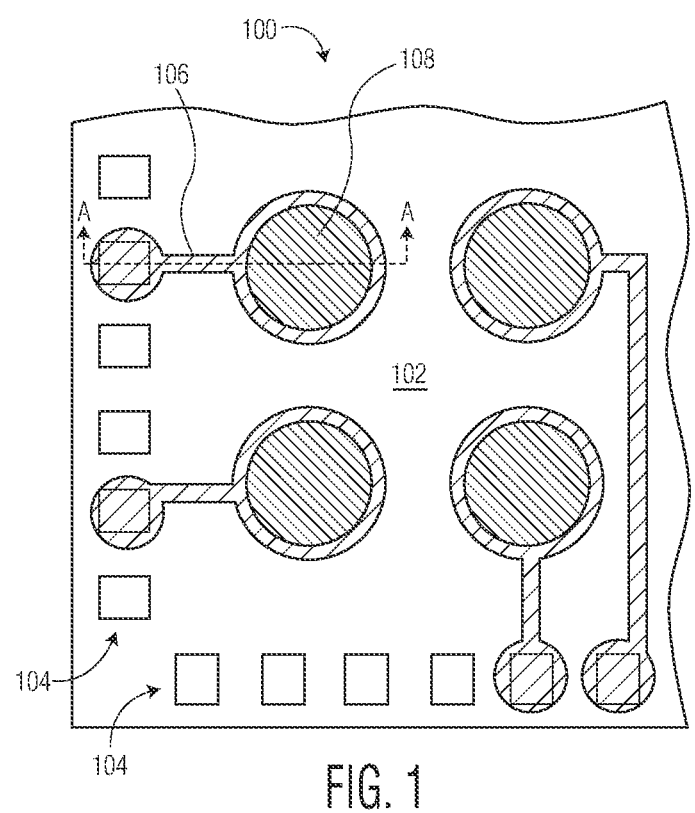
FIG. 1 illustrates, in a simplified plan view, an example semiconductor device having an under bump structure in accordance with an embodiment.

FIG. 1 illustrates, in a simplified plan view, a portion of an example semiconductor device 100 having an under bump structure in accordance with an embodiment. The device 100 includes a semiconductor die 102, a non-conductive layer (not shown) formed over the final passivation of the semiconductor die, and a conductive (e.g., copper) layer 106 formed over the non-conductive layer. In this embodiment, the conductive layer 106 is patterned to form a conductive portion of the under bump structure and interconnect to a bond pad 104 of the semiconductor die 102. In this embodiment, the conductive layer 106 may be characterized as a redistribution layer (RDL). A conductive ball connector 108 is placed and affixed to the conductive portion of the under bump structure. Detailed features of the device 100 such as a package encapsulant are not shown for illustration purposes. Even though the embodiment of FIG. 1 is depicted in a "fan-in" configuration, embodiments in other configurations (e.g., "fan-out") are anticipated by this disclosure. Cross-sectional views of the example semiconductor device 100 taken along line A-A of FIG. 1 at stages of manufacture are depicted in FIG. 2 through FIG. 6.

The semiconductor die 102 has an active side (e.g., major side having circuitry) and a backside (e.g., major side opposite of the active side). The semiconductor die 102 depicted in FIG. 1 is in an active side up orientation. The semiconductor die 102 includes bond pads 104 at the active side configured for connection to printed circuit board (PCB) by way of the conductive layer 106 and the under bump structure, for example. The semiconductor die 102 may be formed from any suitable semiconductor material, such as silicon, germanium, gallium arsenide, gallium nitride, silicon nitride, silicon carbide, and the like. The semiconductor die 102 may further include any digital circuits, analog circuits, RF circuits, memory, signal processor, MEMS, sensors, the like, and combinations thereof. The conductive ball connectors (e.g., solder balls) 108 affixed to the conductive portions of the under bump structures of device 100 may be in the form of suitable conductive structures such as solder balls, gold studs, copper pillars, and the like.

FIG. 2 through FIG. 6 illustrate, in simplified cross-sectional views, a portion 200 of the example semiconductor device 100 taken along line A-A of FIG. 1 at stages of manufacture in accordance with an embodiment.

Figure 2:
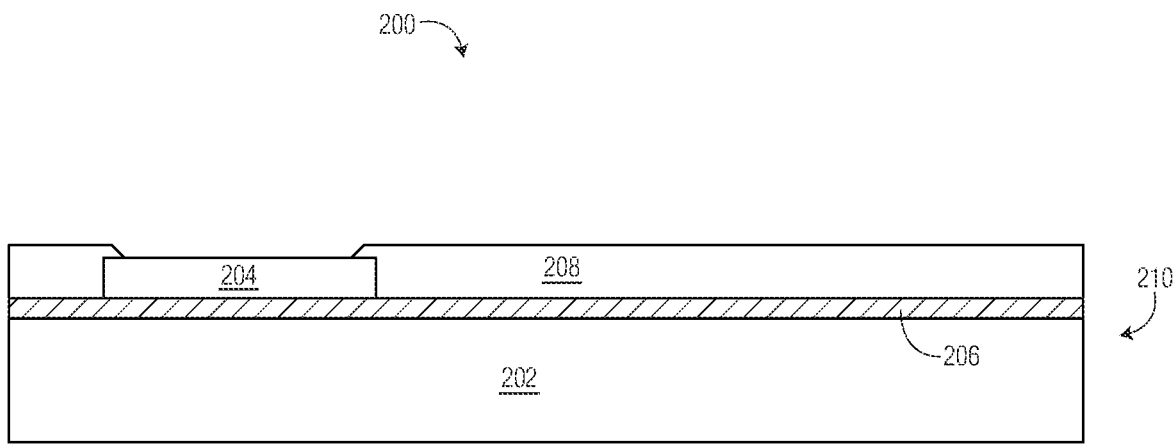
FIG. 2 through FIG. 6 illustrate, in simplified cross-sectional views, the example semiconductor device taken along line A-A of FIG. 1 at stages of manufacture in accordance with an embodiment.

FIG. 2 illustrates the example semiconductor device portion 200 at a stage of manufacture in accordance with an embodiment. At this stage of manufacture, a semiconductor die 210 is provided. In this embodiment, the semiconductor die 210 includes a substrate 202, a conductive interconnect trace 206 (e.g., copper, aluminum, or other suitable metal), a bond pad 204 conductively connected to the trace, and a final passivation layer 208 formed over the active side of the die. In some embodiments, the semiconductor die 210 may be provided as a wafer or portion of a wafer. The semiconductor die may include any number of conductive interconnect layers and passivation layers. For illustration purposes, a top interconnect layer forming trace 206 and a final passivation layer 208 are depicted.

Figure 3:
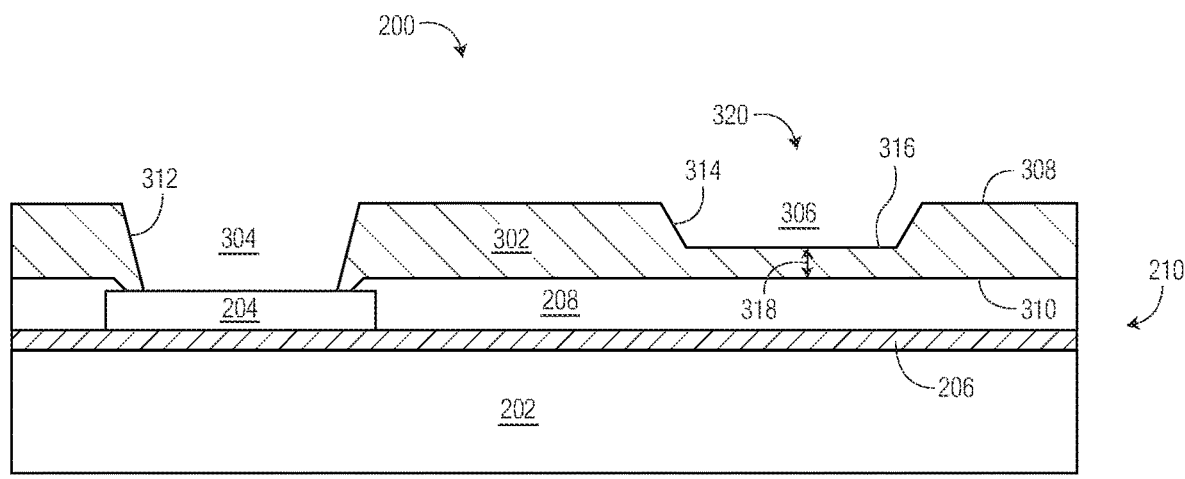

FIG. 3 illustrates the example semiconductor device portion 200 at a subsequent stage of manufacture in accordance with an embodiment. At this stage of manufacture, a non-conductive layer 302 is formed over the semiconductor die 210. The non-conductive layer 302 is deposited or otherwise applied on the top surface of the semiconductor die 210. The non-conductive 302 layer may be formed from a photo-imageable polymer material characterized as a photosensitive solder mask material layer or molding compound material. In this embodiment, an opening 304 and a cavity 306 are patterned and formed in the non-conductive layer. In this embodiment, the opening 304 may be formed using known masking and exposure techniques whereas the cavity 306 may be formed using known mask lensing exposure techniques to limit the depth of the cavity, for example.

The opening 304 is formed through the non-conductive layer 302 and located over the bond pad 204 such that a substantial portion of a top surface of the bond pad 204 is exposed. Sidewalls 312 of the opening 304 surround the exposed portion of the bond pad 204. The cavity 306 is formed at a top surface 308 of the non-conductive layer 302 and located over the semiconductor die 210. The cavity 306 includes sidewalls 314 and a bottom surface 316. A portion of the non-conductive layer 302 remains between the bottom surface 316 of the cavity and a bottom surface 310 of the non-conductive layer. The portion of the of the non-conductive layer 302 between the cavity bottom surface 316 and the non-conductive layer bottom surface 310 is configured to have a predetermined thickness 318. In this embodiment, the predetermined thickness is approximately 2 microns or greater. In this embodiment, the cavity 306 serves as a basis for an under bump structure 320.

Figure 4:
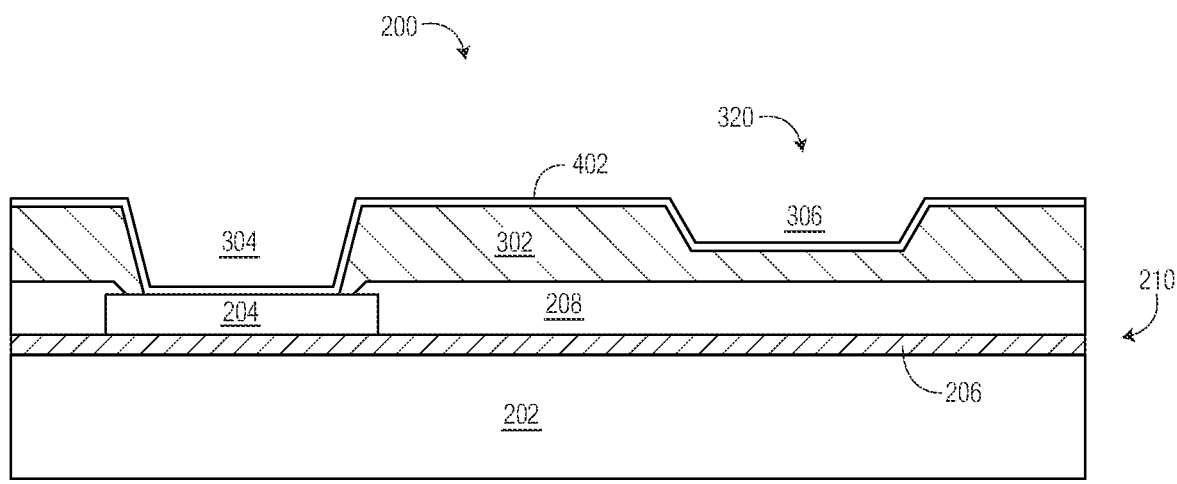

FIG. 4 illustrates the example semiconductor device portion 200 at a subsequent stage of manufacture in accordance with an embodiment. At this stage of manufacture, a seed layer 402 is formed over the non-conductive layer 302 and exposed portion of the bond pad 204. The seed layer 402 is formed as a relatively thin layer and may include titanium, tungsten, palladium, copper, or suitable combinations thereof conducive for plating or metallization, for example. The seed layer 402 may also serve as a barrier layer to avoid diffusion into the bond pad 204 and enhance adhesion to underlying non-conductive layer 302.

Figure 5:
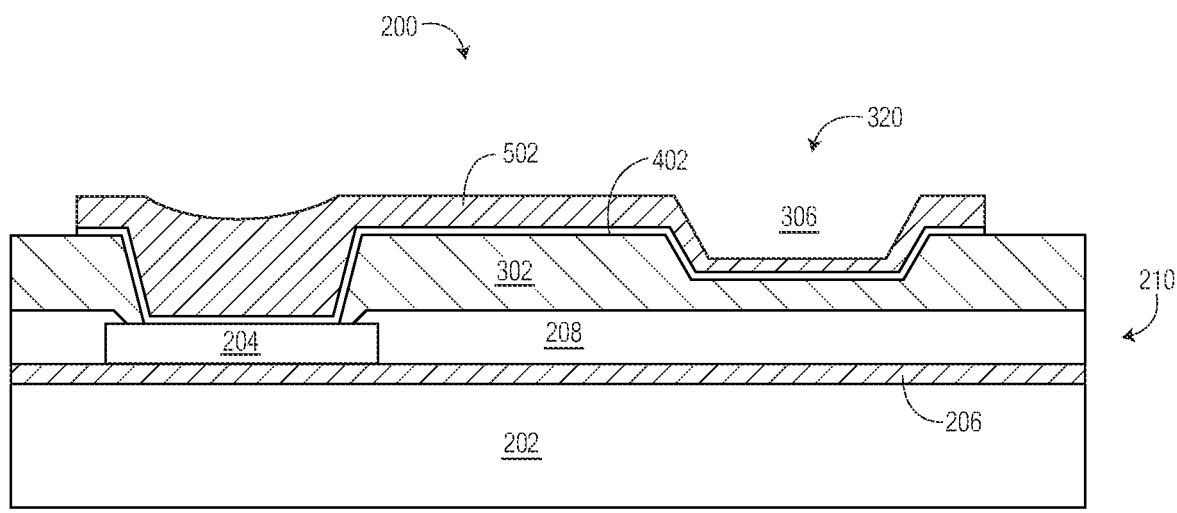

FIG. 5 illustrates the example semiconductor device portion 200 at a subsequent stage of manufacture in accordance with an embodiment. At this stage of manufacture, a conductive layer 502 is formed on seed layer 402. In this embodiment, the conductive layer 502 includes copper and is formed by utilizing the seed layer 402 in a copper plating process. The copper plating process may be characterized as an electroless process or an electroplating process. The conductive layer 502 forms a conformal conductive layer over the exposed pad region as well as the cavity 306 of the under bump structure 320. The conductive layer 502 is patterned and configured to interconnect the bond pad 204 with the conductive layer portion over the cavity 302 of the under bump structure 320. In this embodiment, the conductive layer 502 may be characterized as a redistribution layer (RDL).

Figure 6:
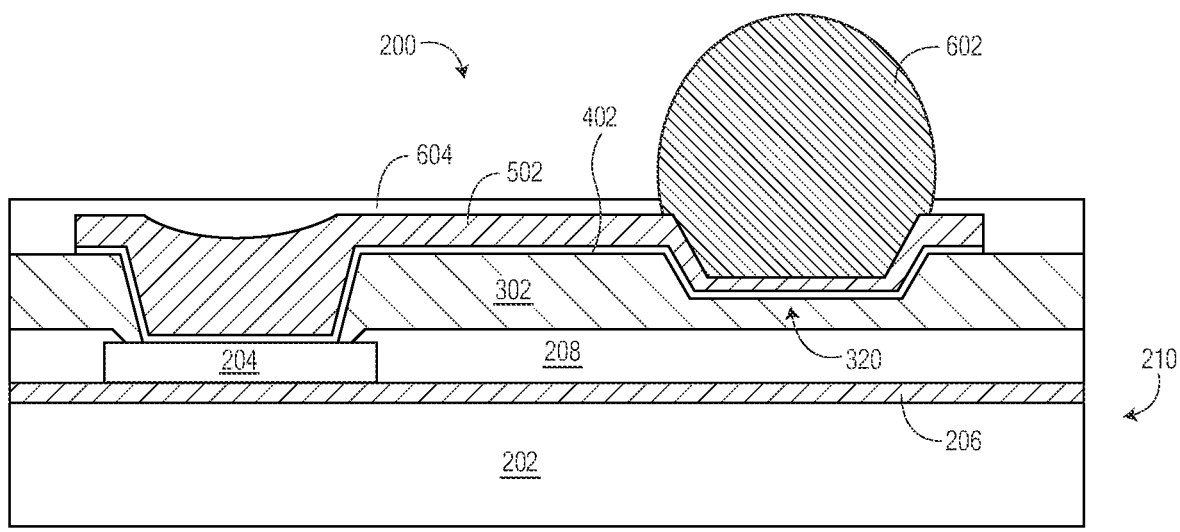

FIG. 6 illustrates the example semiconductor device portion 200 at a subsequent stage of manufacture in accordance with an embodiment. At this stage of manufacture, a conductive ball connector 602 (e.g., solder ball) is attached to the under bump structure 320. The conductive ball connector 602 is placed onto the cavity of the under bump structure 320 and reflowed. A flux material may be placed in the cavity before placing the conductive ball connector 602 onto the under bump structure 320 to improve wetting and adhesion. In this embodiment, the conductive ball connector 602 is formed as a solder ball. In other embodiments, the conductive ball connector 602 may be formed as a solder bump, gold stud, copper pillar, or the like. After attaching the conductive ball connector 602 to the under bump structure 602, an anti-tarnish or preservative material 604 may be applied over exposed portions of the conductive layer 502. The anti-tarnish or preservative material 604 may bond with the conductive layer 502 in a manner that protects exposed surfaces of the conductive layer 502 from oxidation or corrosion, for example.

Figure 7:
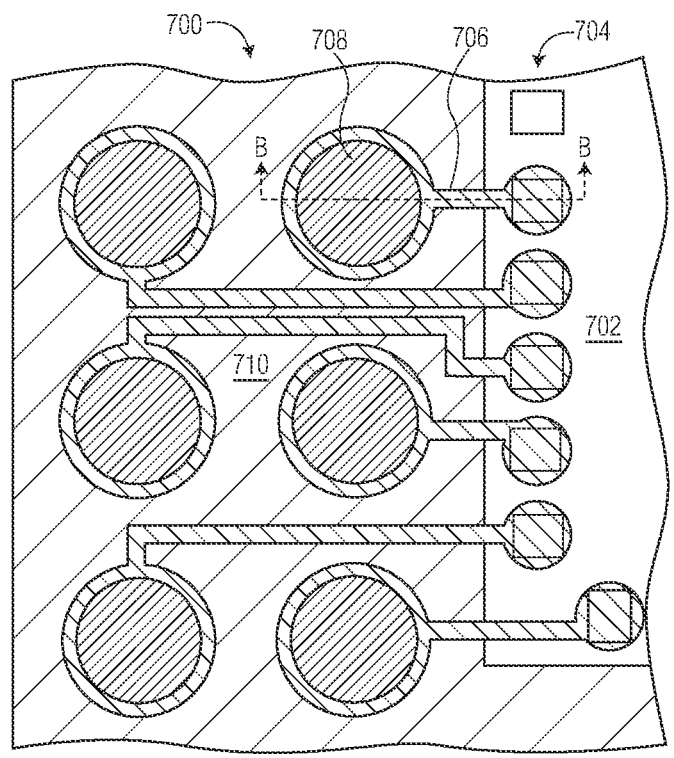
FIG. 7 illustrates, in a simplified plan view, an alternative example semiconductor device having an under bump structure in accordance with an embodiment.

FIG. 7 illustrates, in a simplified plan view, a portion of an alternative example semiconductor device 700 having an under bump structure in accordance with an embodiment. In this embodiment, the device 700 is depicted in a "fan-out" configuration having the under bump structure formed over a package encapsulant 710. The device 700 includes a semiconductor die 702, a non-conductive layer (not shown) formed over the final passivation of the semiconductor die, a conductive (e.g., copper) layer 706 formed over the non-conductive layer, and the encapsulant 710 encapsulating a portion of the semiconductor die 702. In this embodiment, the conductive layer 706 is patterned to form a conductive portion of the under bump structure and interconnect to a bond pad 704 of the semiconductor die 702. In this embodiment, the conductive layer 706 may be characterized as a redistribution layer (RDL). A conductive ball connector 708 is placed and affixed to the conductive portion of the under bump structure. A cross-sectional view of the example semiconductor device 700 taken along line B-B of FIG. 7 at a stage of manufacture is depicted in FIG. 8.

The semiconductor die 702 has an active side (e.g., major side having circuitry) and a backside (e.g., major side opposite of the active side). The semiconductor die 702 depicted in FIG. 7 is encapsulated with in an exposed active side up orientation. The semiconductor die 702 includes bond pads 704 at the active side configured for connection to printed circuit board (PCB) by way of the conductive layer 706 and the under bump structure, for example. The semiconductor die 702 may be formed from any suitable semiconductor material, such as silicon, germanium, gallium arsenide, gallium nitride, silicon nitride, silicon carbide, and the like. The semiconductor die 702 may further include any digital circuits, analog circuits, RF circuits, memory, signal processor, MEMS, sensors, the like, and combinations thereof. The conductive ball connectors (e.g., solder balls) 708 affixed to the conductive portions of the under bump structures of device 700 may be in the form of suitable conductive structures such as solder balls, gold studs, copper pillars, and the like.

Figure 8:
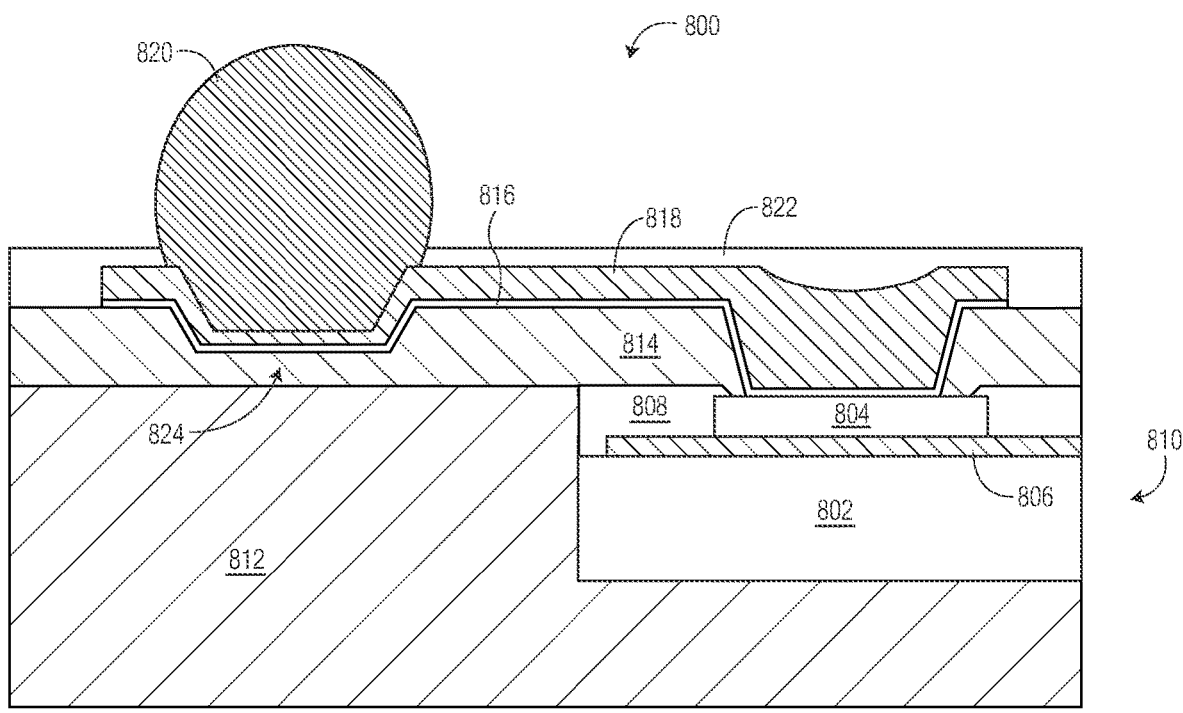
FIG. 8 illustrates, in a simplified cross-sectional view, the example semiconductor device taken along line B-B of FIG. 7 at a stage of manufacture in accordance with an embodiment.

FIG. 8 illustrates, in a simplified cross-sectional view, a portion 800 of the example semiconductor device 700 taken along line B-B of FIG. 7 at a stage of manufacture in accordance with an embodiment. At this stage of manufacture, a semiconductor die 810 partially encapsulated with an encapsulant 812 is provided. The active surface of the semiconductor die 810 is exposed (e.g., not encapsulated). The semiconductor die 810 includes a substrate 802, a conductive interconnect trace 806 (e.g., copper, aluminum, or other suitable metal), a bond pad 804 conductively connected to the trace, and a final passivation layer 808 formed over the active side of the die.

A non-conductive layer 814 is formed over the semiconductor die 810 and encapsulant 812. The non-conductive

814 layer may be formed from a photo-imageable polymer material characterized as a photosensitive solder mask material layer or a molding compound material. In this embodiment, an opening and a cavity are patterned and formed in the non-conductive layer 814. The opening is formed through the non-conductive layer 814 and located over the bond pad 804. The cavity is formed at a top surface of the non-conductive layer 814 and located over the encapsulant 812. A portion of the non-conductive layer 814 remains between a bottom surface of the cavity and a bottom surface of the non-conductive layer. In this embodiment, the cavity serves as a basis for an under bump structure 824.

A seed layer 816 is formed over the non-conductive layer 814 and exposed portion of the bond pad 804. The seed layer 816 is formed as a relatively thin layer and may include titanium, tungsten, palladium, copper, or suitable combinations thereof conducive for plating or metallization, for example. A conductive layer 818 (e.g., copper) is formed by utilizing the seed layer 816 in a plating process. The conductive layer 818 forms a conformal conductive layer over the exposed pad region as well as the cavity of the under bump structure 824. The conductive layer 818 is patterned and configured to interconnect the bond pad 804 with the conductive layer portion over the cavity of the under bump structure 824. In this embodiment, the conductive layer 818 may be characterized as a redistribution layer (RDL).

A conductive ball connector 820 (e.g., solder ball) is attached to the under bump structure 824. The conductive ball connector 820 is placed onto the cavity of the under bump structure 824 and reflowed. In this embodiment, the conductive ball connector 820 is formed as a solder ball. In other embodiments, the conductive ball connector 820 may be formed as a solder bump, gold stud, copper pillar, or the like. After attaching the conductive ball connector 820 to the under bump structure 824, an anti-tarnish or preservative material 822 may be applied over exposed portions of the conductive layer 818. The anti-tarnish or preservative material 822 may bond with the conductive layer 818 in a manner that protects exposed surfaces of the conductive layer 818 from oxidation or corrosion, for example.

Generally, there is provided, a method including depositing a non-conductive layer over a semiconductor die; forming an opening in the non-conductive layer, the opening exposing a portion of a bond pad of the semiconductor die; forming a cavity in the non-conductive layer, a portion of the non-conductive layer remaining between a bottom surface of the cavity and a bottom surface of the non-conductive layer; and forming a conductive layer over the non-conductive layer and the portion of the bond pad, the conductive layer configured to interconnect the bond pad with a conductive layer portion over the cavity. The non-conductive layer may be formed directly on a passivation layer of the semiconductor die. The method may further include forming a seed layer over the non-conductive layer and the exposed portion of the bond pad before forming the conductive layer. The conductive layer portion over the cavity may be configured for attachment of a ball connector. The non-conductive layer may be characterized as a photosensitive solder mask material layer or a molding compound material layer. The cavity may be formed in a portion of the non-conductive layer located over the semiconductor die. The cavity may be formed in a portion of the non-conductive layer located over a package encapsulant. The portion of the non-conductive layer remaining between the bottom surface of the cavity and the bottom surface of the non-conductive layer may have a thickness of approximately 2 microns or greater. The method may further include forming a protectant layer over at least exposed portions of the conductive layer.

In another embodiment, there is provided, a semiconductor device including a semiconductor die having a passivation layer, an opening in the passivation layer exposing a portion of a top surface of a bond pad; a non-conductive layer formed over the semiconductor die; an opening formed through the non-conductive layer exposing the portion of the top surface of the bond pad; a cavity formed in a top surface of the non-conductive layer, a portion of the non-conductive layer remaining between a bottom surface of the cavity and a bottom surface of the non-conductive layer; and a conductive layer formed over the non-conductive layer and the portion of the top surface of the bond pad, the conductive layer patterned and configured to interconnect the bond pad with a conductive layer portion over the cavity. The conductive layer portion over the cavity may be configured for attachment of a ball connector. The non-conductive layer may be characterized as a layer comprising a photosensitive solder mask material or a molding compound material layer. The semiconductor device may further include a protectant layer formed over at least exposed portions of the conductive layer. The semiconductor device may further include a seed layer formed on the non-conductive layer and the exposed surface of the bond pad, the conductive layer plated on the seed layer. The cavity formed in the top surface of the non-conductive layer may be located over the semiconductor die.

In yet another embodiment, there is provided, a method including depositing a non-conductive layer over a semiconductor die; forming an opening through the non-conductive layer, the opening exposing a portion of a top surface of a bond pad of the semiconductor die; forming a cavity in the non-conductive layer, a portion of the non-conductive layer remaining between a bottom surface of the cavity and a bottom surface of the non-conductive layer; forming a conductive layer over the non-conductive layer and the portion of the top surface of the bond pad; and patterning the conductive layer to interconnect the bond pad with a portion of the conductive layer formed over the cavity. The non-conductive layer may be formed directly on a passivation layer of the semiconductor die. The portion of the conductive layer formed over the cavity may be configured for attachment of a ball connector. The method may further include forming a seed layer over the non-conductive layer and the exposed surface of the bond pad before forming the conductive layer. The cavity may be formed in a portion of the non-conductive layer located over a package encapsulant.

By now, it should be appreciated that there has been provided a low cost semiconductor device packaging with under bump structure. The under bump structure is formed utilizing the redistribution layer of a wafer level chip scale packaging (WLCSP), for example. A cavity formed in a non-conductive layer formed over the semiconductor device serves as a basis for the under bump structure. The redistribution layer is formed over the non-conductive layer, including the cavity, and provides interconnect traces from a bond pad of the semiconductor device to the under bump structure. The redistribution layer portion over the cavity serves as a "socket" of the under bump structure configured for placement and attachment of a solder ball, for example. By utilizing the redistribution layer to form the under bump structure, a simplified WLCSP structure is formed, and manufacturing costs may be significantly reduced.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   depositing a non-conductive layer over a semiconductor die;
   forming an opening in the non-conductive layer, the opening exposing a portion of a bond pad of the semiconductor die;
   forming a cavity in a portion of the non-conductive layer located over a package encapsulant a portion of the non-conductive layer remaining between a bottom surface of the cavity and a bottom surface of the non-conductive layer; and
   forming a conductive layer over the non-conductive layer and the portion of the bond pad, the conductive layer configured to interconnect the bond pad with a conductive layer portion over the cavity, the conductive layer conformal with the cavity to form a recess in the conductive layer portion within sidewalls of the cavity.

2. The method of claim 1, wherein the non-conductive layer is formed directly on a passivation layer of the semiconductor die.

3. The method of claim 1, further comprising forming a seed layer over the non-conductive layer and the exposed portion of the bond pad before forming the conductive layer.

4. The method of claim 1, wherein the recess in the conductive layer portion over the cavity is configured for attachment of a ball connector, the ball connector to occupy the recess in the conductive layer portion.

5. The method of claim 1, wherein the non-conductive layer is characterized as a photosensitive solder mask material layer or a molding compound material layer.

6. The method of claim 1, wherein the cavity is formed in a portion of the non-conductive layer located over the semiconductor die.

7. The method of claim 1, wherein the portion of the non-conductive layer remaining between the bottom surface of the cavity and the bottom surface of the non-conductive layer has a thickness of approximately 2 microns or greater.

8. The method of claim 1, further comprising forming a protectant layer over at least exposed portions of the conductive layer.

9. A method comprising:
   depositing a non-conductive layer over a semiconductor die;
   forming an opening through the non-conductive layer, the opening exposing a portion of a top surface of a bond pad of the semiconductor die;
   forming a cavity in the non-conductive layer, a portion of the non-conductive layer remaining between a bottom surface of the cavity and a bottom surface of the non-conductive layer;
   forming a conductive layer over the non-conductive layer and the portion of the top surface of the bond pad, the conductive layer conformal with the cavity to form a recess in the conductive layer portion within sidewalls of the cavity; and
   patterning the conductive layer to interconnect the bond pad with a portion of the conductive layer formed over the cavity.

10. The method of claim 9, wherein the non-conductive layer is formed directly on a passivation layer of the semiconductor die.

11. The method of claim 9, wherein the recess in the portion of the conductive layer formed over the cavity is configured for attachment of a ball connector the ball connector to occupy the recess in the conductive layer portion.

12. The method of claim 9, further comprising forming a seed layer over the non-conductive layer and the exposed surface of the bond pad before forming the conductive layer.

13. The method of claim 9, wherein the cavity is formed in a portion of the non-conductive layer located over a package encapsulant.

* * * * *